United States Patent
Noël

(10) Patent No.: US 7,355,381 B2
(45) Date of Patent: Apr. 8, 2008

(54) CURRENT SENSOR WITH REDUCED SENSITIVITY TO PARASITIC MAGNETIC FIELDS

(75) Inventor: Sébastien Noël, Oullins (FR)

(73) Assignee: ABB Entrelec, Villeurbanne (FR)

( * ) Notice: Subject to any disclaimer, the term of this patent is extended or adjusted under 35 U.S.C. 154(b) by 112 days.

(21) Appl. No.: 10/581,736

(22) PCT Filed: Nov. 24, 2004

(86) PCT No.: PCT/FR2004/002999

§ 371 (c)(1),
(2), (4) Date: Jul. 7, 2006

(87) PCT Pub. No.: WO2005/066642

PCT Pub. Date: Jul. 21, 2005

(65) Prior Publication Data

US 2007/0164724 A1    Jul. 19, 2007

(30) Foreign Application Priority Data

Dec. 8, 2003 (FR) .................................... 03 14331

(51) Int. Cl.
*G01R 33/00* (2006.01)
(52) U.S. Cl. ............................ 324/117 R; 324/117 H; 324/126
(58) Field of Classification Search ............ None
See application file for complete search history.

(56) References Cited

U.S. PATENT DOCUMENTS

| | | | |
|---|---|---|---|
| 4,625,166 A | | 11/1986 | Steingroever et al. |
| 5,793,206 A | * | 8/1998 | Goldfine et al. ............ 324/242 |
| 7,259,545 B2 | * | 8/2007 | Stauth et al. ........... 324/117 R |

FOREIGN PATENT DOCUMENTS

| EP | 1 030 183 A1 | 8/2000 |
|---|---|---|
| WO | WO 02/46777 A2 | 6/2002 |

OTHER PUBLICATIONS

Database WPI, Section EI, Week 197946, Derwent Publications Ltd., London, GB; Class S01, AN 1979-K7728B, XP002291323 -& SU 649 045 A (Dolgikh V V) Feb. 25, 1979 abstract.

* cited by examiner

*Primary Examiner*—Minh N. Tang
(74) *Attorney, Agent, or Firm*—Young & Thompson

(57) ABSTRACT

A current sensor includes: several magnetic-field-sensitive components which are disposed on a support such as to be distributed around a conductor through which a current to be measured flows, and a processing circuit which receives an output signal from the components, each component having at least one first terminal which is connected to a summing point by a summing resistor and a second terminal which is connected to a common point. Moreover, all of the resistors are connected to a first conductor which is connected to the summing point and all of the second terminals are connected to a second conductor which is connected to the common point. The support includes a printed circuit, while the two conductors include conductor tracks of the printed circuit, which are routed in a zigzag manner on the printed circuit such as to form a bunched or braided conductor.

16 Claims, 6 Drawing Sheets

CURRENT SENSOR WITH REDUCED SENSITIVITY TO PARASITIC MAGNETIC FIELDS

The present invention relates to a current sensor adapted to measure the value of the current flowing in a conductor.

The present invention relates more particularly to a current sensor, of the type without a magnetic core, comprising a support adapted to be positioned about the conductor through which the current to be measured passes, several components sensitive to the magnetic field disposed on said support so as to be distributed about that conductor, and a processing circuit receiving an output signal from said component sensitive to the magnetic field. Each component sensitive to the magnetic field comprises at least one first and one second terminal. The first terminals of all the components sensitive to the magnetic field are connected by respective summing resistances to a summing point connected to a first input terminal of the processing circuit. The second terminals of all the components sensitive to the magnetic field are connected to a second input terminal of the processing circuit. The components sensitive to the magnetic field can for example be Hall effect probes, magnetoresistances or other elements adapted to produce an electric signal when they are placed in a magnetic field. Sensors of this type are known for example from the documents FR 2 789 763 and U.S. Pat. No. 4,625,166.

The current sensors without a magnetic core have numerous advantages relative to current sensors with a magnetic core. It is thus that the current sensors without a magnetic core are much lighter than current sensors with a magnetic core, precisely because of the absence of the magnetic core. Moreover, they have a greater range of use both from the point of view of the maximum frequency as from the point of view of the maximum value of current intensity that they can measure, because of the absence of saturation of a magnetic core. Moreover, the current sensors without a magnetic core offer the advantage of not being subject to heating, such that they can be more compact. Furthermore, these current sensors are capable of measuring, without being destroyed, momentary surges in the conductor through which the current to be measured passes. This is due to the fact that the components sensitive to the magnetic field are capable of measuring large magnetic fields arising from the large current intensity flowing in the conductor, and that the electronic processing circuit at the output of the components can become saturated without deteriorating.

However, the current sensors without a magnetic core have the drawback of being sensitive to parasitic or non-homogeneous magnetic fields, and to variations of the magnetic field.

The present invention thus has for its object to provide a current sensor of the type defined in the preamble, which will be less sensitive to parasitic or non-homogeneous magnetic fields and to variations of the magnetic field.

To this end, the invention has for its object a current sensor adapted to measure the value of the current flowing in a conductor, comprising a support adapted to be positioned about the conductor through which the current to be measured flows, several components sensitive to the magnetic field, disposed on said support so as to be distributed about said conductor, and a processing circuit receiving an output signal from said component sensitive to the magnetic field, each component sensitive to the magnetic field comprising at least one first and one second terminal, the first terminals of all the components sensitive to the magnetic field being connected by respective summing resistances at a summing point connected to a first input terminal of the processing circuit, the second terminals of all the components sensitive to the magnetic field being connected to a second input terminal of the processing circuit, characterized in that all the summing resistances are connected to a first conductor connected to the summing point, all the second terminals of the components sensitive to the magnetic field are connected to a second conductor connected to the second input terminal of the processing circuit, the support is constituted by a printed circuit, and the first and second conductors are constituted respectively by first and second conductive tracks of the printed circuit which are routed in zigzag fashion on the printed circuit so as to form a twist or a braid.

The current sensor according to the invention can moreover have one or several of the following characteristics:
  the printed circuit has two printed surfaces and the conductive tracks are routed over the two surfaces of the printed circuit,
  each of the first and second conductive tracks forms a closed loop entirely about an opening provided in the printed circuit for the passage of the conductor through which the current to be measured flows;
  each summing resistance has its two terminals which are connected respectively to the nearest of the first terminal of the corresponding component sensitive to the magnetic field and nearest the first conductive track;
  the printed circuit comprises on at least one of its two surfaces a ground plane closely surrounding the conductive tracks of the printed circuit;
  the ground plane forms a closed loop entirely about said opening;
  the second conductive track is connected to the ground plane at a point on the latter which is adjacent the first conductive track, and said summing point to which is connected the first conductive track is adjacent said point of the ground plane to which is connected the second conductive track;
  the components sensitive to the magnetic field are Hall effect probes;
  each Hall effect probe comprises third and fourth terminals, the third terminals of all the Hall effect probes being connected to a third conductive track of the printed circuit, which is connected to a point at a first fixed potential and which is routed in zigzag fashion over said printed circuit so as to form a twist or a braid with the first and second conductive tracks;
  the third conductive track forms a closed loop entirely about said opening;
  the second and fourth terminals of the Hall effect probes are connected together to the second conductive track of the printed circuit, itself connected to a second fixed or grounded potential;
  said point on the first fixed potential which is connected to the third conductive track is located on the printed circuit beside said summing point and second connection to the ground plane.

The invention will be better understood from the description which follows, given by way of non-limiting example with reference to the accompanying drawings, in which.

Figure 1:
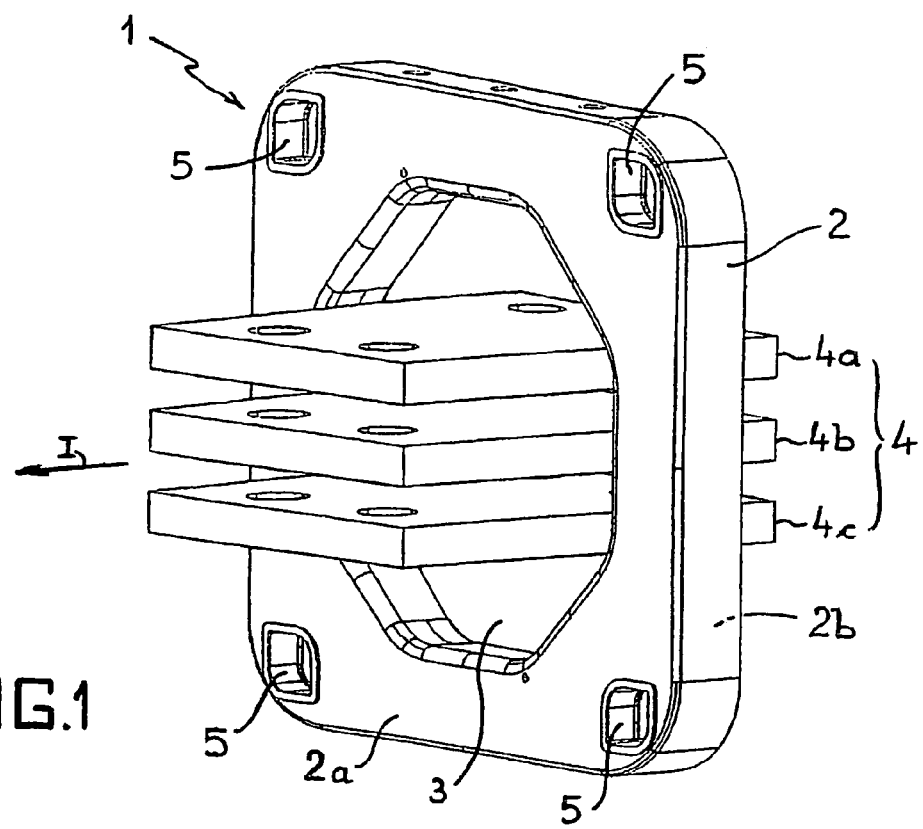
FIG. 1 is a perspective view showing a current sensor according to the invention, disposed about a set of conductive bars through which the current to be measured flows.

Referring first of all to FIG. 1, there can be seen a current sensor 1 according to the invention, which comprises a housing 2 of an insulating material, which contains active and/or functional elements of the current sensor (not shown in FIG. 1).

The housing 2 has a generally parallelepipedal shape, with two principal opposite surfaces 2a and 2b, of generally square or rectangular shape with rounded corners. The housing 2 comprises a wide central opening 3 which passes entirely through it, from the surface 2a to the surface 2b, and thanks to which the current sensor 1 can be placed about an electrical conductor 4 through which the current I to be measured flows.

In FIG. 1, the conductor 4 is constituted by a set of conductive bars, for example three bars 4a, 4b and 4c. Of course, the number of the conductive bars can be greater or less than three, while staying within the limits permitted by the size of the opening 3 of the housing 2. Moreover, the set of conductive bars 4 could be replaced by one or several electrical cables through which the current to be measured flows.

As shown in FIG. 1, the housing 2 comprises four holes 5 which pass through the housing 2 from side to side, from the surface 2a to the surface 2b, to receive securement screws (not shown) permitting the securement of the current sensor 1 upright or recumbent on an appropriate support, either directly or indirectly by means of mounting elements, as is well known (see for example FR 2 793 884).

Figure 2:
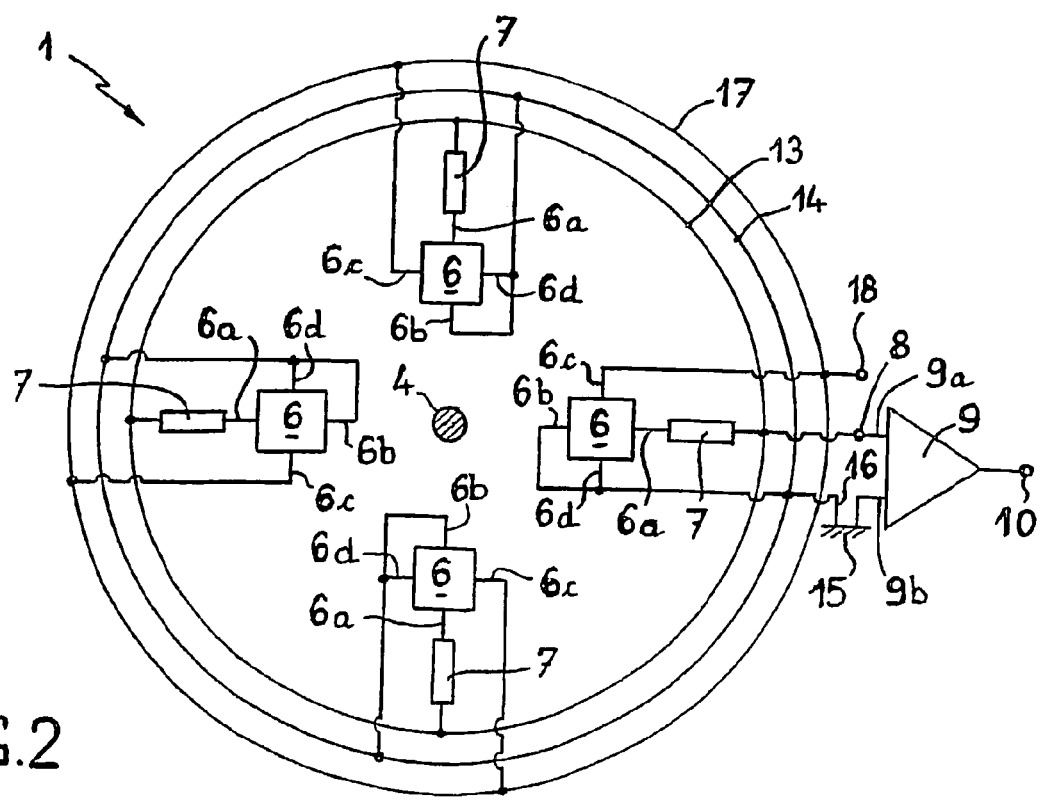
FIG. 2 is a simplified electrical diagram of the current sensor of FIG. 1.

Referring now to the electrical diagram of FIG. 2, it can be seen that the current sensor 1 comprises several components 6 sensitive to the magnetic field, whose output signals are sent respectively through summing resistances 7 to a summing point 8 itself connected electrically to a first input 9a of a processing circuit 9 whose output 10 can consist of the output of the current sensor 1.

The components 6 sensitive to the magnetic field can for example be constituted by Hall effect probes. The probes 6 are carried by a support (not shown in FIG. 2) so as to be distributed about the conductor 4 through which the current to be measured flows.

The above-mentioned support is constituted by a printed circuit 11, of which a specific example of embodiment is shown in FIGS. 5 to 8 and which will be described in greater detail later. For the moment, it suffices to note that the printed circuit 11 comprises in its middle an opening 12 whose shape and size corresponds to those of the opening 3 of the housing 2.

Figure 5:
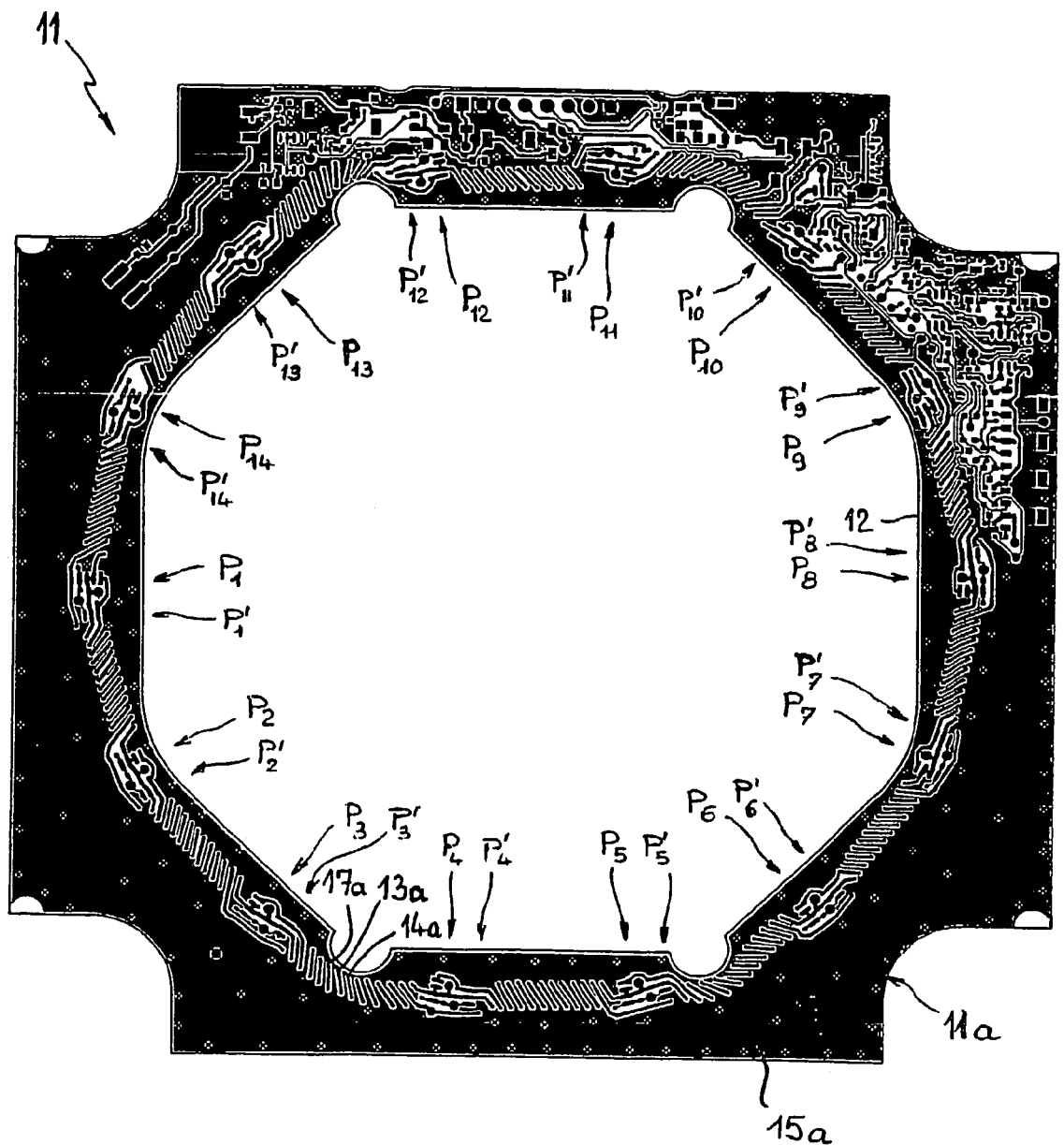
FIG. 5 is a view of the front surface of the printed circuit of a current sensor according to the invention.
Figure 6:
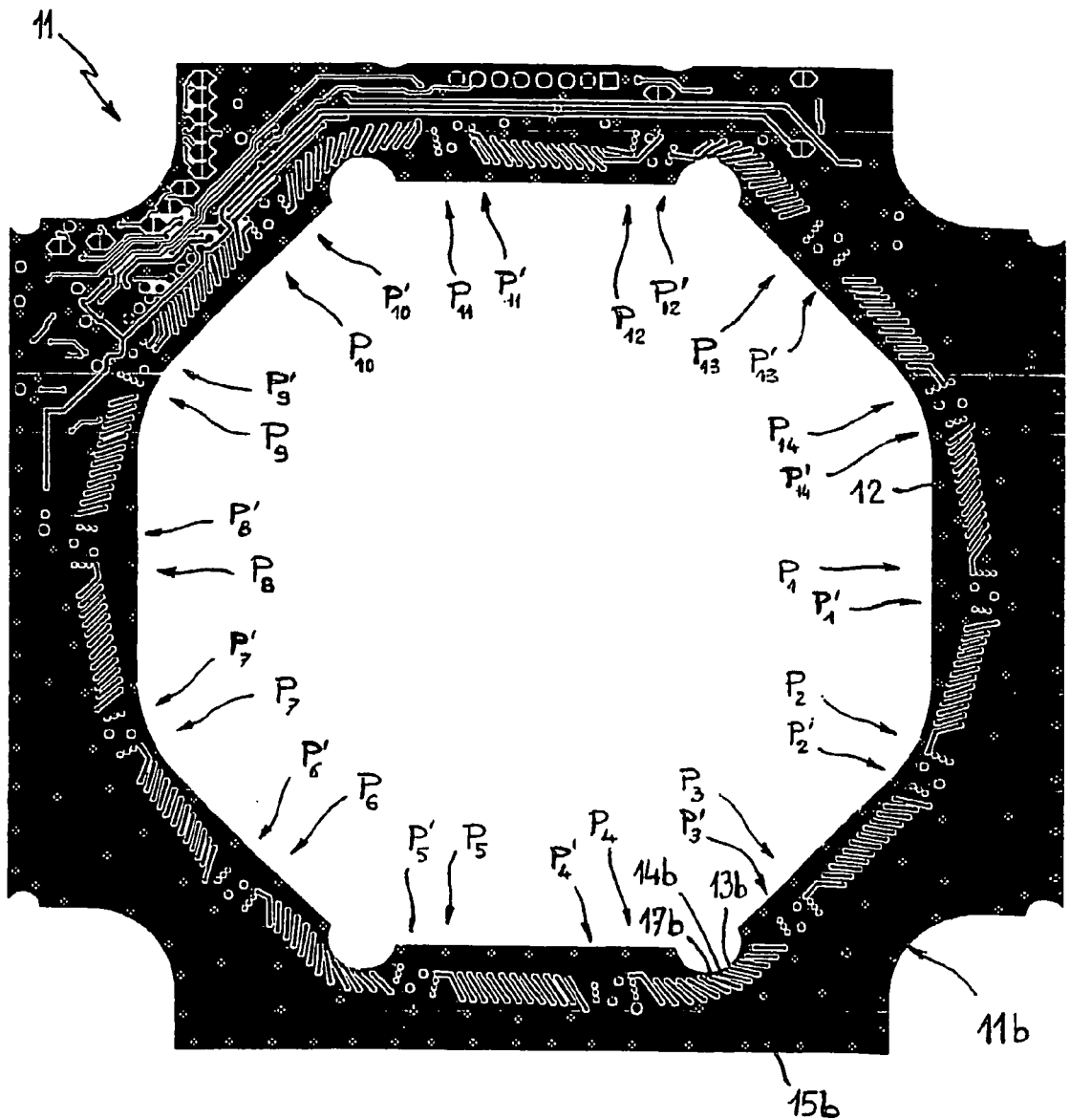
FIG. 6 is a view of the rear surface of the printed circuit of the current sensor.
Figure 7:
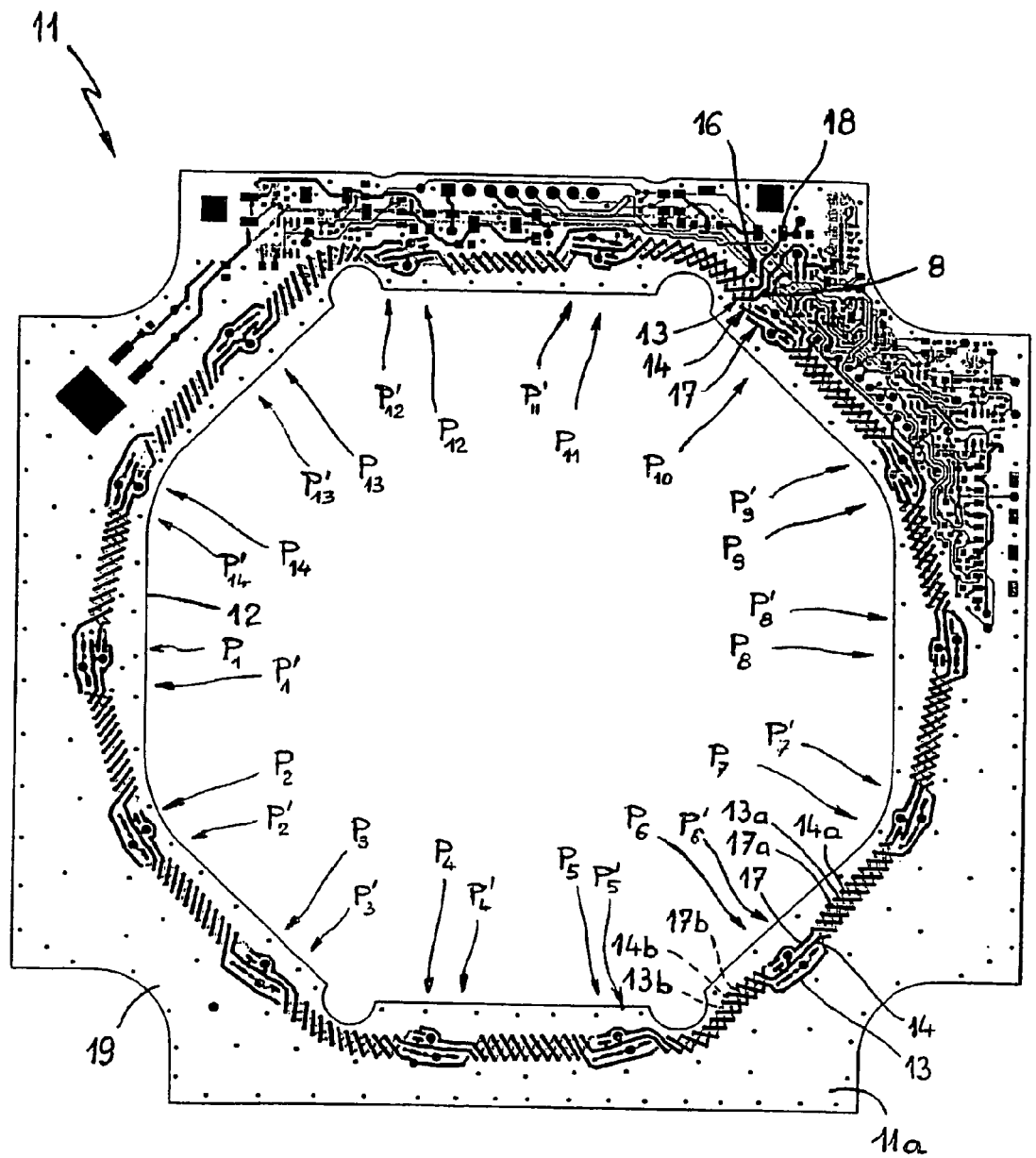
FIG. 7 is a view showing simultaneously the conductive tracks of the front and rear surfaces of the printed circuit of FIGS. 5 and 6, the substrate of the printed circuit being taken to be transparent and without a grounding plane.

In the diagram of FIG. 2, there are shown only four probes 6 for reasons of clarity of this figure, but it follows that the invention is not limited to a sensor comprising four probes 6 or four components sensitive to the magnetic field. For example, the sensor 1 could comprise fourteen Hall effect probes as indicated in FIGS. 5 to 7, in which the probes are not shown, but their positions on the printed circuit 11 are indicated respectively by references $P_1$ to $P_{14}$.

As shown in FIG. 2, each probe 6 comprises four terminals 6a to 6d. All the terminals 6a, which deliver usable output signals from the probes 6, are connected through resistances 7 to a first conductor 13 which is itself connected to the summing point 8 mentioned above. The two terminals 6b and 6d of each probe 6 are connected together to one another and to a second conductor 14 which is common to all the probes 6 and which is itself connected to the ground 15 preferably at a single common point indicated at 16 in FIG. 2. The other terminal 9b of the processing circuit 9, which can be constituted by an operational amplifier, is also connected to the ground 15 as shown in FIG. 2. Finally, all the terminals 6c of the probes 6 are connected to a third conductor 17 which is itself connected to a point 18. The point 18 is at a first fixed potential, for example +5V, whilst the ground 15 is at a second fixed potential which serves as a reference potential for measuring the current.

So as to render the current sensor 1 less sensitive to parasitic magnetic fields and to variations of the magnetic field, the three conductors 13, 14 and 17 are twisted or braided together as will now be explained with reference to FIGS. 3 and 5 to 8.

The printed circuit 11 comprises a substrate 19 (FIGS. 3, 7 and 8) constituted by a plated or overlaid material, of a plastic insulating material, if desired reinforced by fibers, such as for example glass fibers. On the two surfaces of the substrate 19 are formed conductive tracks, for example of copper, by known photogravure techniques.

Figure 3:
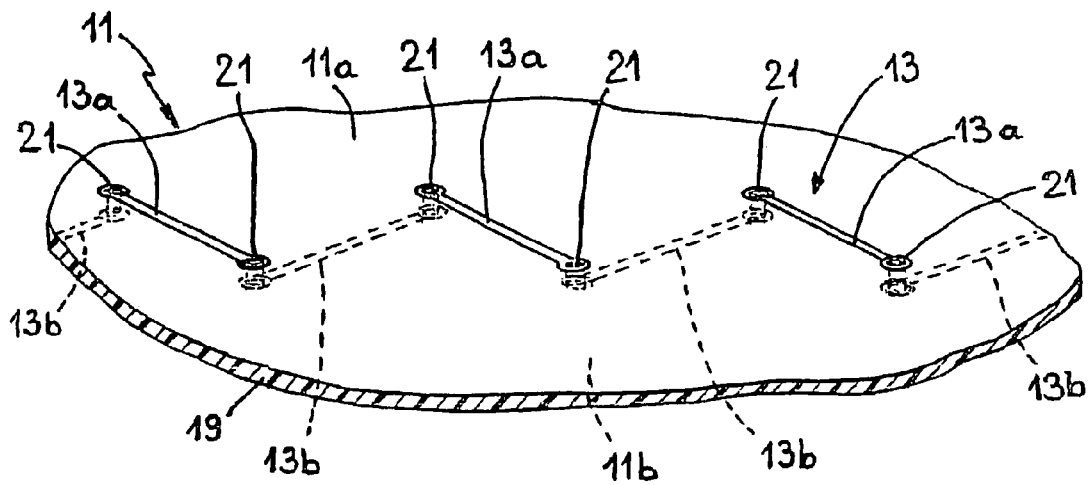
FIG. 3 is a perspective view showing a portion of a printed circuit bearing a conductive track disposed in zigzag fashion.
Figure 8:
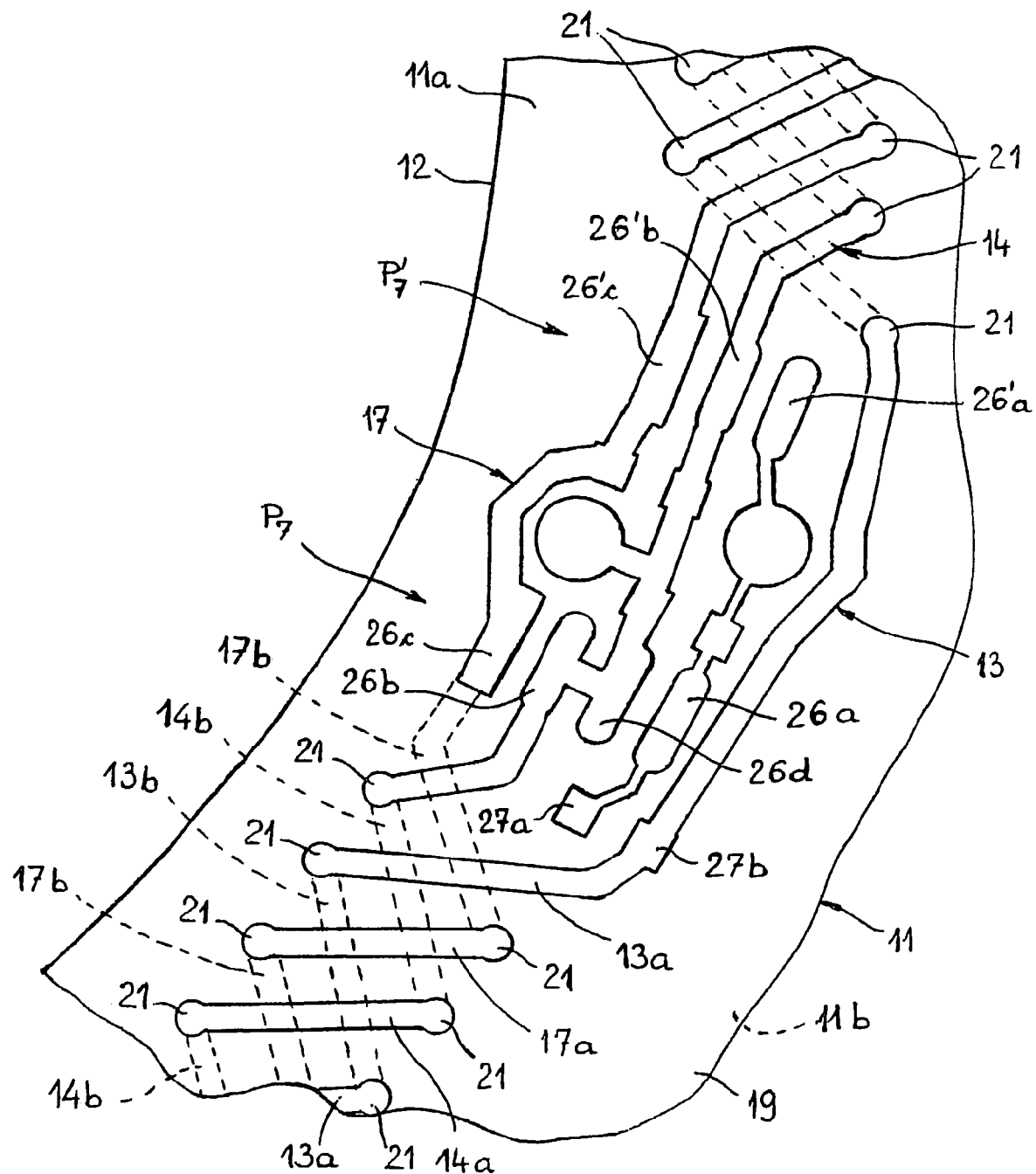
FIG. 8 shows, on a larger scale, a portion of the printed circuit of FIG. 7, in the region of implantation of one of the components sensitive to the magnetic field.

In particular, each of the three conductors 13, 14 and 17 mentioned above is constituted by a conductive track, which is designated by the same reference numeral 13, 14 or 17 in FIGS. 7 and 8 and which is arranged in zigzag as is shown in FIG. 3 with respect to the conductive track 13. In FIG. 3, which represents on a larger scale a small portion of the printed circuit 11, there is shown only the conductive track 13 for greater clarity of the drawing. As shown, in the regions of the printed circuit 11 located between the emplacements of the Hall effect probes 6, the track 13 is constituted by a series of conductive segments designated alternatively 13a and 13b. The segments 13a, for example the uneven order segments, are located on the front surface 11a of the printed circuit 11 (FIGS. 3 and 5), whilst the segments 13b, for example the even order segments, are located on the rear surface 11b of the printed circuit 11 (FIGS. 3 and 6). The segments 13a are connected in series with the segments 13b by conductive cross members 21.

Similarly, the conductive tracks 14 and 17 are formed by segments 14a and 17a located on the front surface 11a of the printed circuit 11 (FIG. 5) and by segments 14b and 17b which are located on the rear surface 11b of the printed circuit 11 (FIG. 6) and which are connected in series respectively with segments 14a and 17a by conductive cross members similar to the conductive cross members 21 as can be seen in FIG. 8.

Preferably, each segment 14a of the conductive track 14, which is connected to the ground 15, is located between a segment 13a of the conductive track 13 and a segment 17a of the conductive track 17 as is clearly visible in FIGS. 5 and 8. Similarly, each segment 14b of the conductive track 14 is located between a segment 13b of the conductive track 13 and a segment 17b of the conductive track 17 as is visible in FIGS. 6 and 8.

In FIG. 7, the segments 13a, 14a and 17a of the conductive tracks 13, 14 and 17 are shown in wide black lines, whilst the segments 13b, 14b and 17b of the conductive tracks 13, 14 and 17 are shown in gray lines, as if they were viewed by transparency through the substrate 19 of the printed circuit 11.

Figure 4:
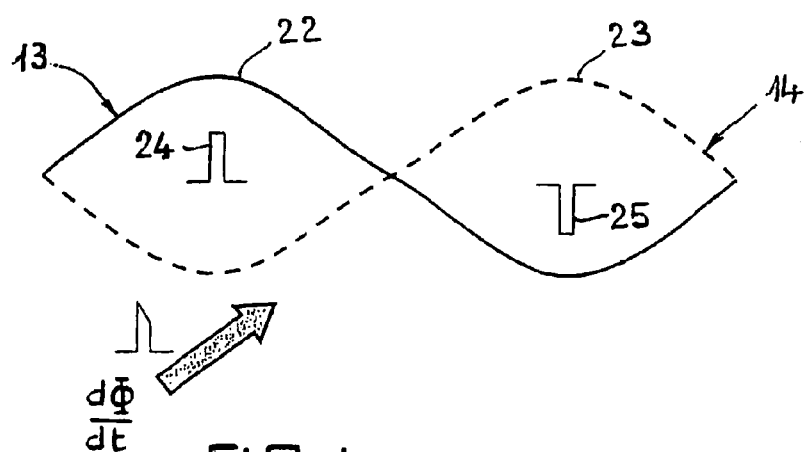
FIG. 4 is a diagram of the principle permitting explaining why the current sensor of the invention is less sensitive to parasitic magnetic fields.

There is similarly obtained for the three conductive tracks 13, 14 and 17 a twisted structure which permits rendering the current sensor 1 less sensitive, or even insensitive to parasitic magnetic field variations. Thus, the arrangement in zigzag of the twisted conductive tracks can be modeled as shown in FIG. 4 with respect to the conductive tracks 13 and 14 (a similar modeling can be carried out with the tracks 14 and 17). When the current sensor is placed in a "severe" magnetic environment, which is to say non-homogeneous, for example when the conductive bar or bars of the set of bars 4 form an angle or an elbow and the sensor 1 is placed near said angle, or else when the sensor 1 is placed near a parasite conductor adjacent to the set of bars 4 through which the current to be measured flows, the variations of magnetic flux created by the parasitic conductor or the non-homogeneous lines of flux passing through the sensor 1 induce electrical voltages in the conductive connections between the Hall effect probes 6. These voltages disturb the signals delivered by the Hall effect probes 6 and the sensor thus delivers erroneous information.

However, as shown in FIG. 4, thanks to the twisted structure of the conductive tracks 13, 14 and 17, the variations $d\Phi/dt$ of the magnetic flux bombarding two successive loops or windings 22 and 23 of the twist will induce a positive voltage 24 in the first winding 22 and a negative voltage 25 in the second winding 23, because this latter receives the flux in reverse direction relative to the first winding. If the two windings 22 and 23 have the same surface, the voltages 24 and 25 have the same absolute value, but opposite signs such that they cancel each other. It will thus be seen that, by providing an even number of windings in the twist formed by the conductive tracks 13 and 14 and by the conductors 14 and 17, it is possible to proceed such that the parasitic electrical voltages induced by variations of parasitic or non-homogeneous magnetic field in the electro-connections connecting the Hall effect probes 6, can be canceled. There would be obtained the same result if the conductive tracks 13, 14 and 17 were disposed in zigzag fashion so as to form a braided structure, but the design would be a bit more complicated and would require a greater number of conductive cross members 21.

In the case in which the opening 3 of the housing 2 of the sensor 1 has a closed contour and, accordingly, also the opening 12 of the printed circuit 11, each of the three conductive tracks 13, 14 and 17 form preferably a closed loop, which is thus short-circuited, as is to be seen in FIGS. 2 and 5 to 7. If the loops closed by the conductive tracks 13, 14 and 17 were open, the variations of magnetic flux would give rise to an electromotive force between the ends of the open loop formed by each conductive track 13, 14 or 17. This would give rise to a measurement error, because the probes 6 are distributed along the conductive tracks.

Preferably, the printed circuit 11 comprises on each of its two surfaces 11a and 11b, a ground plane 15a or 15b, respectively, for example of copper, which closely surrounds the conductive tracks of the printed circuit. The two ground planes 15a and 15b are shown by wide black areas in FIGS. 5 and 6, and they are designated overall by the reference 15 in FIG. 2. The two ground planes 15a and 15b are electrically interconnected by at least one conductive crosspiece (not shown) which is disposed in the substrate 19 of the printed circuit 11 in a way similar to the conductive crosspieces 21 shown in FIG. 3.

Preferably, at least one of the two ground planes 15a and 15b, and preferably both ground planes, form a closed loop, for reasons similar to those which were indicated above with respect to the conductive tracks 13, 14 and 17. In this way, it is possible to be free from parasitic voltages induced in the ground plane.

Preferably, the conductive track 14 is connected to the ground plane 15 at a single point 16 (FIG. 7) on the latter, which is adjacent to the conductive track 13, and the summing point 8 to which is connected the conductive track 13 is adjacent to the above-mentioned point 16. Similarly, the point 18 which is at the first fixed potential (+5V) and to which is connected the conductive track 17, is located on the printed circuit 11 beside the summing point 8 and the point 16 of connection to the ground plane 15. These arrangements have the effect of avoiding possible locally induced voltages in the conductive tracks and/or in the ground plane of the printed circuit 11, so that they will not be added to the signals provided by the Hall effect probes 6 and will accordingly not disturb the measurement of the current.

Finally, each summing resistance 7 has its two terminals which are connected respectively to the nearest terminal 6a of the corresponding Hall effect probe 6 and to the nearest conductive track 13. This is clearly shown in FIG. 8, which shows, on an enlarged scale, a portion of the printed circuit 11 corresponding to one of the Hall effect probes, more precisely the one which is located at position $P_7$. In FIG. 8, the conductive areas 26a to 26d of the printed circuit 11 are areas to which are respectively soldered the terminals 6a to 6d of the Hall effect probe 6 located in the position $P_7$, whilst the conductive areas 27a and 27b of the printed circuit 11 are regions to which are soldered the two terminals of the corresponding summing resistance 7. As can also be seen in FIG. 8, the terminals 6b to 6d of the Hall effect probe 6 are connected to the nearest of the conductive tracks 14 and 17 because the conductive regions 26b and 26d serving for the connection of the terminals 6b and 6d are located on the track 14 and because the conductive region 26c serving for the conduction of the terminal 6c is located on the track 17.

There exist Hall effect probes whose housing comprises only three terminals or connection tongues. The printed circuit 11 can preferably comprise moreover, by respective adjacent positions $P'_1$ to $P'_{14}$ at the positions $P_1$ to $P_{14}$, conductive areas 26'a, 26'b and 26'c (FIG. 8) to which can be welded the terminals of the probes with three terminals.

It follows that the embodiment of the invention which has been described above has been given purely by way of indicative example and is in no way limiting, and that numerous modifications can easily be provided by those skilled in the art without thereby departing from the scope of the invention. Thus, although the invention has been described with respect to a sensor comprising Hall effect probes, these latter could be replaced by other elements sensitive to the magnetic field, such as for example magnetoresistances.

Moreover, although it is advantageous that the conductive tracks 13, 14 and 17 and the ground plane 15 form closed loops (short-circuited) entirely about the opening 12 of the printed circuit 11 (in the case of a current sensor 11 whose housing 2 has an opening 3 presenting a closed contour), it would be not be a departure from the scope of the invention if the conductive tracks 13, 14 and 17 and the ground plane 15 did not form a closed loop, as might be the case when the housing of the current sensor comprises an opening with a non-closed contour such that the sensor can be easily emplaced straddling the conductor 4 by a transverse movement relative to the longitudinal direction of said conductor, without this requiring disconnection.

It could also be envisaged to provide the current sensor in two portions that can be separated from each other to permit the emplacement of the sensor about a conductor through which the current to be measured flows, means being then provided to permit a mechanical connection of the two portions of the current sensor, and other means to permit suitable electrical connections between the two portions of the current sensor when they are assembled with each other, so as to establish closed loops for the conductive tracks 13, 14 and 17 connecting the components 6 that are sensitive to a magnetic field.

Moreover, although the structure and shape of the twist of the conductors or the conductive tracks 13, 14 and 17 described above is obtained by using a printed circuit 11 having two printed surfaces 11*a* and 11*b*, the arrangement in zigzag of said conductive tracks and the structure in the form of a twist or a braid could be obtained by using a circuit printed on only a single surface. In this case, each conductive track 13, 14 or 17 will be formed in part (one conductive segment out of two) by staples (also called "straps" by those skilled in this art) straddling the conductive segments of the other conductive tracks.

According to another modified embodiment, the arrangement in zigzag of the conductive tracks and the structure in the form of a twist or braid could also be obtained by using a multilayer printed circuit comprising conductive tracks of at least one external surface of a multilayer substrate and on at least one intermediate layer of said substrate.

The invention claimed is:

1. Current sensor adapted to measure the value of the current flowing in a conductor (4), comprising a support (11) adapted to be positioned about the conductor through which the current to be measured flows, several components (6) sensitive to the magnetic field, disposed on said support (11) so as to be distributed about said conductor (4), and a processing circuit (9) receiving an output signal from said components (6) sensitive to the magnetic field, each component sensitive to the magnetic field comprising at least one first and one second terminal, the first terminals (6*a*) of all the components (6) sensitive to the magnetic field being connected by respective summing resistances (7) to a summing point (8) connected to a first input terminal (9*a*) of the processing circuit (9), the second terminals (6*b*) of all the components (6) sensitive to the magnetic field being connected to a second input terminal (9*b*) of the processing circuit, characterized in that all the summing resistances (7) are connected to a first conductor (31) connected to the summing point (8), all the second terminals (6*b*) of the components (6) sensitive to the magnetic field are connected to a second conductor (14) connected to the second input terminal (9*b*) of the processing circuit (9), the support (11) is constituted by a printed circuit, and the first and second conductors (13 and 14) are constituted respectively by first and second conductive tracks of the printed circuit which are arranged in zigzag on the printed circuit (11) so as to form a twist or a braid.

2. Current sensor according to claim 1, characterized in that the printed circuit (11) has two printed surfaces (11*a*, 11*b*) and the conductive tracks (13, 14) are routed over the two surfaces (11*a* and 11*b*) of the printed circuit.

3. Current sensor according to claim 1, characterized in that each of the first and second conductive tracks (13 and 14) forms a closed loop entirely about an opening (12) provided in the printed circuit (11) for the passage of the conductor (4) through which the current to be measured flows.

4. Current sensor according to claim 1, characterized in that each summing resistance (7) has its two terminals which are connected respectively to the nearest of the first terminal (6*a*) of the corresponding component (6) sensitive to the magnetic field and to the nearest of the first conductive track (13).

5. Current sensor according to claim 1, characterized in that the printed circuit (11) comprises on at least one of its two surfaces (11*a* and 11*b*) a ground plane (15*a*, 15*b*) closely surrounding the conductive tracks (13, 14) of the printed circuit (11).

6. Current sensor according to claim 5, characterized in that each of the first and second conductive tracks (13 and 14) forms a closed loop entirely about an opening (12) provided in the printed circuit (11) for the passage of the conductor (4) through which the current to be measured flows, and the ground plane (15*a*, 15*b*) forms a closed loop entirely about said opening (12).

7. Current sensor according to claim 5, characterized in that the second conductive track (14) is connected to the ground plane (15*a*, 15*b*) at a point (16) on the latter which is adjacent the first conductive track (13), and said summing point (8) to which is connected the first conductive track (13) is adjacent said point (16) of the ground plane to which is connected the second conductive track (14).

8. Current sensor according to claim 1, characterized in that the components (6) sensitive to the magnetic field are Hall effect probes.

9. Current sensor according to claim 8, characterized in that each Hall effect probe (6) comprises third and fourth terminals (6*c*, 6*d*), the third terminals (6*c*) of all the Hall effect probes (6) being connected to a third conductive track (17) of the printed circuit (11), which is connected to a point (18) at a first fixed potential and which is arranged in zigzag over said printed circuit so as to form a twist or a braid with the first and second conductive tracks (13, 14).

10. Current sensor according to claim 9, characterized in that each of the first and second conductive tracks (13 and 14) forms a closed loop entirely about an opening (12) provided in the printed circuit (11) for the passage of the conductor (4) through which the current to be measured flows, and the third conductive track forms a closed loop entirely about said opening (12).

11. Current sensor according to claim 9, characterized in that the second and fourth terminals (6*b*, 6*d*) of the Hall effect probes (6) are connected together at the second conductive track (14) of the printed circuit (11), itself connected to a second fixed potential or ground potential (15).

12. Current sensor according to claim 10, characterized in that said point (18) on the first fixed potential to which is connected the third conductive track (17) is located on the printed circuit (11) beside said summing point (8) and said point (16) of connection of the ground plane (15).

13. Current sensor according to claim 2, characterized in that each of the first and second conductive tracks (13 and 14) forms a closed 1loop entirely about an opening (12) provided in the printed circuit (11) for the passage of the conductor (4) through which the current to be measured flows.

14. Current sensor according to claim 6, characterized in that the second conductive track (14) is connected to the ground plane (15*a*, 15*b*) at a point (16) on the latter which is adjacent the first conductive track (13), and said summing point (8) to which is connected the first conductive track (13) is adjacent said point (16) of the ground plane to which is connected the second conductive track (14).

15. Current sensor according to claim 10, characterized in that the second and fourth terminals (6*b*, 6*d*) of the Hall effect probes (6) are connected together at the second conductive track (14) of the printed circuit (11), itself connected to a second fixed potential or ground potential (15).

16. Current sensor according to claim 11, characterized in that said point (18) on the first fixed potential to which is connected the third conductive track (17) is located on the printed circuit (11) beside said summing point (8) and said point (16) of connection of the ground plane (15).

* * * * *